US012765285B2

(12) United States Patent
Sivadas et al.

(10) Patent No.: US 12,765,285 B2
(45) Date of Patent: Oct. 13, 2026

(54) N-TYPE OF TRANSITION METAL DICHALCOGENIDE CHANNELS VIA SURFACE CHARGE TRANSFER FROM A DOPANT LAYER

(71) Applicant: SAMSUNG ELECTRONICS CO., LTD., Suwon-si (KR)

(72) Inventors: Nikhil Sivadas, Boston, MA (US); Yongwoo Shin, Concord, MA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 388 days.

(21) Appl. No.: 18/402,474

(22) Filed: Jan. 2, 2024

(65) Prior Publication Data

US 2025/0140559 A1 May 1, 2025

Related U.S. Application Data

(60) Provisional application No. 63/546,837, filed on Nov. 1, 2023.

(51) Int. Cl.

| | |
|---|---|
| ***H10D 30/47*** | (2025.01) |
| ***H10P 32/10*** | (2026.01) |
| ***H10P 32/14*** | (2026.01) |

(52) U.S. Cl.

CPC .............. *H10P 32/19* (2026.01); *H10P 32/14* (2026.01)

(58) Field of Classification Search

CPC . H10P 14/20; H10P 14/3442; H10D 30/6757; H10D 30/47; H10D 30/481

See application file for complete search history.

(56) References Cited

U.S. PATENT DOCUMENTS

| | | | |
|---|---|---|---|
| 9,190,509 B2 | 11/2015 | Nayfeh | |
| 9,899,537 B2 | 2/2018 | Lin et al. | |
| 10,026,751 B2 | 7/2018 | Rakshit et al. | |
| 10,269,564 B2 | 4/2019 | Lin et al. | |
| 10,269,981 B2 | 4/2019 | Chen et al. | |
| 10,388,732 B1 | 8/2019 | Frougier et al. | |
| 11,121,243 B2 | 9/2021 | Cho et al. | |
| 11,450,666 B2 * | 9/2022 | Khaderbad | H10D 30/6757 |
| 2022/0102499 A1 | 3/2022 | Naylor et al. | |
| 2023/0099814 A1 | 3/2023 | Maxey et al. | |
| 2025/0079169 A1 * | 3/2025 | Vandalon | H10P 14/3436 |

FOREIGN PATENT DOCUMENTS

| | | |
|---|---|---|
| KR | 10-2581497 B1 | 9/2023 |

OTHER PUBLICATIONS

Modulation doping and control the carrier concentration in 2-dimensional transition metal dichalcogenides, Sivadas et al., Advanced Materials Lab, Samsung Advanced Institute of Technology—America, Samsung Semiconductor, Inc., Cambridge, Massachusetts 02138, USA, Apr. 22, 2025.*

First-principles study of metals, metalloids and halogens doped monolayer MoSe2 to tune its electronic properties, Asif et al, Physica Scripta 98105917, 2023.*

* cited by examiner

*Primary Examiner* — Haidung D Nguyen

(74) *Attorney, Agent, or Firm* — Harness, Dickey & Pierce, P.L.C.

(57) ABSTRACT

A structure includes a dopant layer at or close to a channel to n-dope TMDs, wherein the dopant layer includes at least one of: at least one of halides ($MX_2$; M=(Ti, Zr, or Hf), X=at least one of {Cl, Br, or I}); at least one of hydroxides ($M(OH)_2$; M=(Ru, Os, or Ni)); $Ca_4As_4$; or $Zn_2H_8N_4Te_2$. A method for fabricating a channel includes depositing a delta-doped layer having a low dielectric constant and a band gap>0.1 eV onto a high-k layer, and n-doping a TMD layer, wherein an absolute value of ionization energy of the delta-doped layer is less than an absolute value of the electron affinity of the TMD layer, the delta-doped layer includes one of a halide, hydroxide, chalcogenide, oxide, arsenide, or multi-anion compound, and a fractional ratio of the delta-doped layer to the high-k layer is 0 to 0.3.

2 Claims, 14 Drawing Sheets
(12 of 14 Drawing Sheet(s) Filed in Color)

S. Su et al., Small Struct., 2, 2000103 (2021)

Z. Hu et al., *Chem. Soc. Rev.*, 2018,47, 3100-3128

Semiconductor
DFT Electron affinity ~ 4.27 eV

Semiconductor
Ionization energy ~ 3.48 eV

N-TYPE OF TRANSITION METAL DICHALCOGENIDE CHANNELS VIA SURFACE CHARGE TRANSFER FROM A DOPANT LAYER

CROSS-REFERENCE TO RELATED APPLICATIONS

This application is based on and claims priority from U.S. Provisional Application No. 63/546,837 filed on Nov. 1, 2023 in the U.S. Patent and Trademark Office, the disclosure of which is incorporated herein by reference in its entirety.

BACKGROUND

1. Field

The subject matter disclosed herein relates to a structure including a dopant layer at or close to a channel to n-dope a transition metal dichalcogenide (TMD) layer. The subject matter disclosed herein also relates to a method to fabricate a channel.

2. Description of the Related Art

The use of high-k dielectrics is crucial for reducing the effective oxide thickness in transistors, which in turn allows for smaller and faster device performance. In this regard, the metronomic progress in CMOS transistor density and switching energy over time is shown in FIG. 1.

The performance of Si-based transistors degrades significantly as the channel thickness is reduced below 4 nm. This limits the application of Si-based transistors for making next-generation transistors that are atomically thin and thereby are faster and more energy efficient.

To make a transistor such as the one shown in FIG. 2 smaller, one approach is geometry scaling, which makes everything in the transistor smaller. Another approach is equivalent scaling, which uses other oxides instead of $SiO_2$, where those other oxides have a lower equivalent oxide thickness (EOT) than $SiO_2$ (that is, oxides which, when used in a smaller layer thickness than $SiO_2$, can give the same device metrics as with $SiO_2$). In particular, by using high-k materials (e.g., $HfO_2$), EOT can be lowered.

Compared to Si-based transistors (SOI in FIG. 3), transition metal dichalcogenide (TMD)-based semiconducting van der Waal's materials ($MX_2$, M=Mo, W; X=S, Se) show robust mobility for channels having an atomically thin layer thickness. Further, as they have a layered structure and the different layers are held together with weak forces, these materials are stable in the monolayer limit with no dangling bonds that can degrade device performance.

For further showing feasibility of TMDs as alternative channel material to Si, the ability to provide both n-doped and p-doped TMD is needed. TMDs like $MoS_2$ naturally form in n-doped. However, controlling the dopant concentration is an important step for device fabrication.

Substitution doping of Re of Mo has been proposed to n-dope $MoS_2$. However, higher concentration of dopants could make these layers metallic, leading to a short circuit. Further, by design, this approach creates more scattering centers in the channel layer which could affect the mobility of electrons.

Another approach is to use surface charge transfer doping (SCTD) between an organic molecule adsorbate and the TMD layer which naturally occurs for appropriate band alignment (see FIG. 4: The Ionization energy, IE of organic layer is smaller than the electron affinity, EA, of TMDs). Unlike substitution doping, this approach does not degrade the crystal quality. However, adding organic molecules to transistors could lead to engineering challenges like thermal stability and scalability.

However, strategies to controllably n-dope TMDs are still absent.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

An object of the disclosure is to provide a new strategy to n-dope transition metal dichalcogenides.

By appropriately adding a dopant layer near the channel layer (e.g., TMD), the present disclosure can achieve n-doping of the nearby TMD channel layer. If the dopant layer has a low dielectric constant, then the effective capacitance that can form due to the charge transfer can be small, which will also minimize RC-delays.

The present disclosure provides a structure including a dopant layer near (at or close to) the channel to n-dope TMDs. The different chemistries for the dopant layer are:

halides ($MX_2$; M=(Ti, Zr, Hf), X=combination of {Cl, Br, I});

hydroxides ($M(OH)_2$; M=(Ru, Os, Ni));

$Ca_4As_4$;

$Zn_2H_8N_4Te_2$

The present disclosure also provide a method to n-dope transition metal dichalcogenides (TMDs) via a dopant layer near the TMD channel. 20 possible candidates for the dopant layer were identified. Surface charge transfer induced electron doping (n-doping) of a TMD channel can be achieved via the strategy of the present disclosure. For doping in the range $0<x<0.3$, the dielectric constant of the high-k layer should be retained. The low-k behavior typically exhibited by these dopant candidates make higher doping concentration ($0<x<1$) possible in the extension and contact regions.

The present disclosure allows to n-dope TMDs using the existing geometry simply by adding an additional dopant layer, all without degrading the device performance by reducing scattering mechanisms.

Advantages of the present disclosure include no need for substitution doping of TMDs to n-dope. Substitution doping can degrade the device performance as it is creating more defects within the channel. The approach of the present disclosure is a non-invasive approach for doping the channel. Further, the good features (large dielectric values) of having a high-k dielectric are retained within the fractional doping specified by the present disclosure. In the extension region and the contact region, the general low-k behavior of the materials allows for larger doping range and higher electron concentration.

Thus, the disclosure includes the following embodiments.

Embodiment 1: A structure comprising a dopant layer at or close to (i.e., within 3 nm) a channel comprising at least one transition metal dichalcogenide to n-dope the at least one transition metal dichalcogenide, wherein the dopant layer comprises at least one of:

(i) at least one of halides represented by $MX_2$, wherein M is Ti, Zr, or Hf, and X is at least one of Cl, Br, or I;

(ii) at least one of hydroxides represented by $(M(OH)_2$, wherein M is Ru, Os, or Ni;

(iii) $Ca_4As_4$; or (iv) $Zn_2H_8N_4Te_2$.

Embodiment 2: The structure according to Embodiment 1, wherein the dopant layer is at the channel to n-dope the at least one transition metal dichalcogenide.

Embodiment 3: The structure according to Embodiment 1, wherein the dopant layer comprises at least one of halides represented by $MX_2$, wherein M is Ti, Zr, or Hf, and X is at least one of Cl, Br, or I.

Embodiment 4: The structure according to Embodiment 1, wherein the dopant layer comprises at least one of hydroxides represented by $M(OH)_2$, wherein M is Ru, Os, or Ni.

Embodiment 5: The structure according to Embodiment 1, wherein the dopant layer comprises $Ca_4As_4$.

Embodiment 6: The structure according to Embodiment 1, wherein the dopant layer comprises $Zn_2H_8N_4Te_2$.

Embodiment 7: The structure according to Embodiment 2, wherein the dopant layer comprises at least one of halides represented by $MX_2$, wherein M is Ti, Zr, or Hf, and X is at least one of Cl, Br, or I.

Embodiment 8: The structure according to Embodiment 2, wherein the dopant layer comprises at least one of hydroxides represented by $M(OH)_2$, wherein M is Ru, Os, or Ni.

Embodiment 9: The structure according to Embodiment 2, wherein the dopant layer comprises $Ca_4As_4$.

Embodiment 10: The structure according to Embodiment 2, wherein the dopant layer comprises $Zn_2H_8N_4Te_2$.

Embodiment 11: A method for fabricating a channel, comprising:

depositing a delta-doped layer onto a high-k layer, and n-doping a transition metal dichalcogenide layer, wherein the delta-doped layer has a low dielectric constant (i.e., below the dielectric constant of silicon nitride; the dielectric constant of the delta-doped layer is preferably below the dielectric constant of silicon dioxide, more preferably below 3.5, still more preferably below 3, and particularly preferably below 2.5), wherein a band gap of the delta-doped layer is >0.1 eV, wherein an absolute value of ionization energy of the delta-doped layer is less than an absolute value of the electron affinity of the transition metal dichalcogenide layer, wherein the delta-doped layer includes one of a halide, hydroxide, chalcogenide, oxide, arsenide, or multi-anion compound, and wherein a fractional ratio of the delta-doped layer to the high-k layer is between 0 and 0.3.

Embodiment 12: The method according to Embodiment 11, wherein the delta-doped layer has a dielectric constant below the dielectric constant of silicon dioxide.

Embodiment 13: The method according to Embodiment 11, wherein the delta-doped layer has a dielectric constant below 3.5.

Embodiment 14: The method according to Embodiment 11, wherein the delta-doped layer has a dielectric constant below 3.0.

Embodiment 15: The method according to Embodiment 11, wherein the delta-doped layer has a dielectric constant below 2.5.

Embodiment 16: The method according to Embodiment 11, wherein the high-k layer has a dielectric constant greater than 15.

BRIEF DESCRIPTION OF DRAWINGS

The patent or application file contains at least one drawing executed in color. Copies of this patent or patent application publication with color drawing(s) will be provided by the Office upon request and payment of the necessary fee.

Example embodiments of the present disclosure will be more clearly understood from the following detailed description taken in conjunction with the accompanying drawings in which.

DETAILED DESCRIPTION OF EXAMPLE EMBODIMENTS

Figure 1:
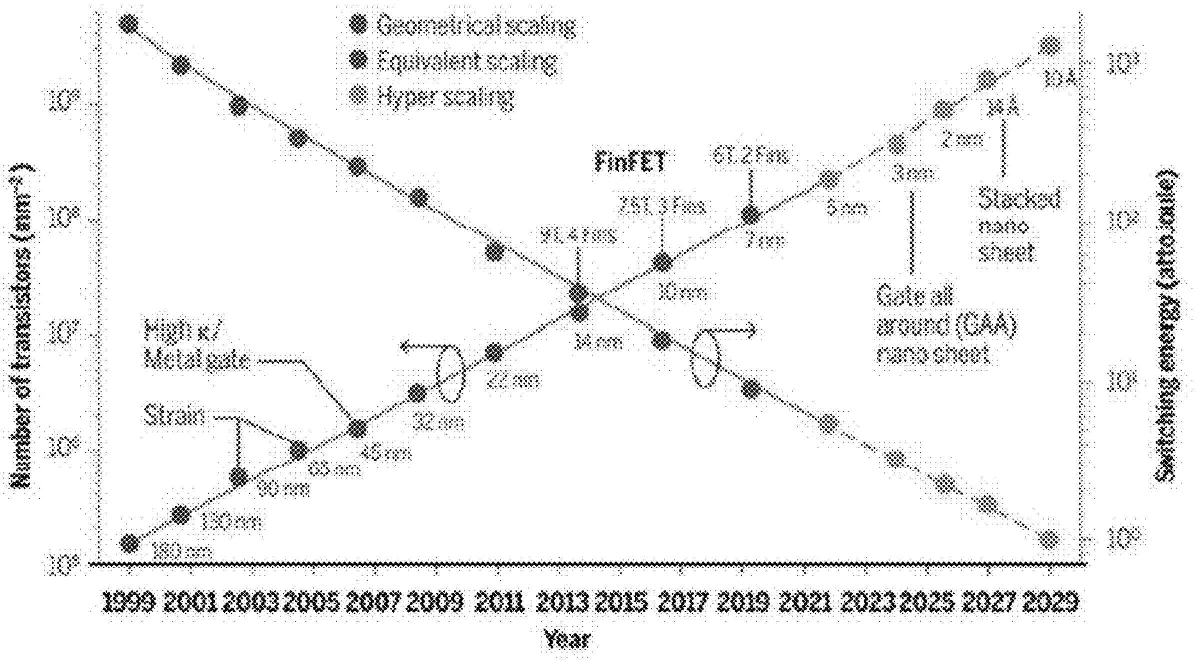
FIG. 1 is a graph showing the metronomic progress in CMOS transistor density and switching energy over time.
Figure 2:
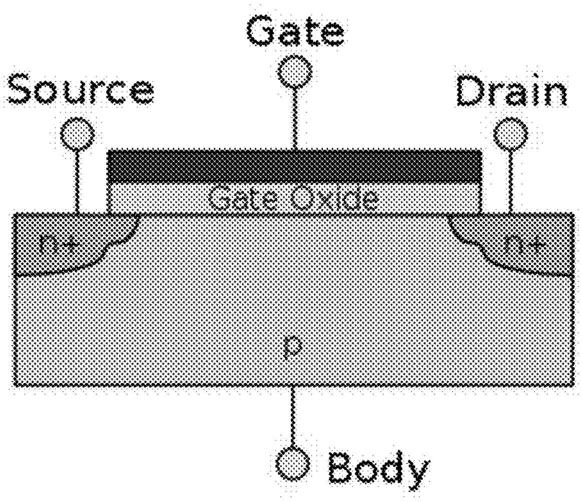
FIG. 2 shows a representative transistor structure.
Figure 3:
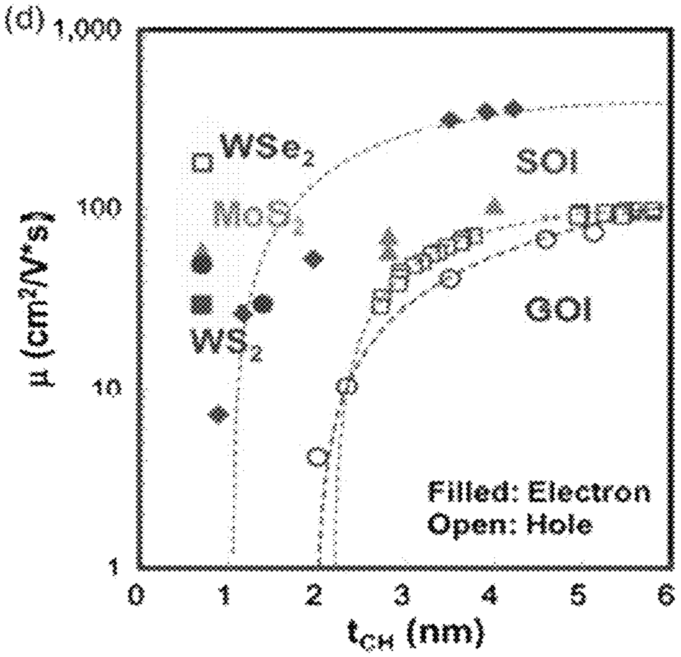
FIG. 3 is a graph showing the mobility (u) of electrons as a function of channel thickness ($t_{CH}$), and illustrates that for Si on insulators (SOI), the mobility degrades when $t_{CH}$ is below 4 nm, while transition metal dichalcogenides ($MoS_2$, $WSe_2$, etc.) show robust mobility for thinner channels.
Figure 4:
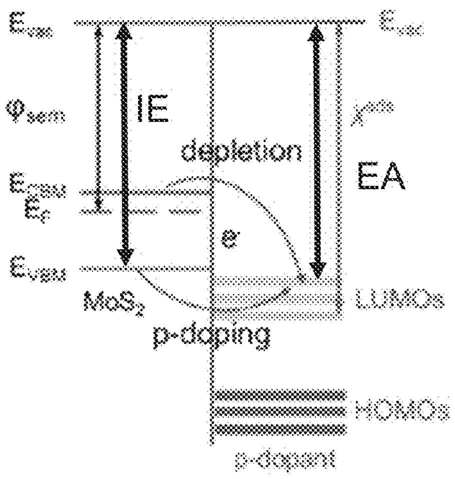
FIG. 4 is a schematic energy level diagram of surface charge transfer doping (SCTD) between organic molecules and $MoS_2$, and illustrates depletion and a p-doping process via SCTD of organic molecules with higher electron affinity (EA) than the ionization energy (IE) of TMDs.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c.

The present disclosure provides a structure including a dopant layer near (at or close to) the channel which can n-dope a TMD channel. In this regard, the term "close to" means a distance within 3 nm. The distance is preferably within 2 nm, and more preferably within 1 nm.

20 candidates were identified for dopant layers that can n-dope TMDs with the correct ionization energy and thermodynamic stability with respect to TMDs. The chemistries include:

halides ($MX_2$; M=(Ti, Zr, Hf), X=combination of {Cl, Br, I});

hydroxides ($M(OH)_2$; M=(Ru, Os, Ni));

$Ca_4As_4$;

$Zn_2H_8N_4Te_2$.

Such a dopant layer can effectively dope the gate-region, the extension region and the contact region. In the gate-region, the original high-k dielectric properties are expected to be present when the fractional ratio of dopant layer to the high-k layer is $0<x<0.3$. The low-k behavior typically exhibited by these dopant candidates make higher doping concentration ($0<x<1$) possible in the extension and contact regions.

The C2DB database was screened for materials with band gap>0.5 eV (semiconductors with minimal leakage current), absolute value of computed ionization energy of dopant layer<absolute value of experimentally reported electron affinity (EA) of $MoS_2$ (see Table 1 below for the experimentally reported EA of $MoS_2$ and other suitable TMDs for the present disclosure).

TABLE 1

| Monolayer Electron Affinity (eV) | Reported |
|---|---|
| $MoS_2$ | 3.9* |
| $MoSe_2$ | 3.5* |
| $WS_2$ | 3.8* |
| $WSe_2$ | 3.6* |

*K. Keyshar et al., ACS Nano, 11, 8, 8223 (2017) + Y. Yang et al., Nano Lett. 20, 12, 8846 (2020)

Figure 5:
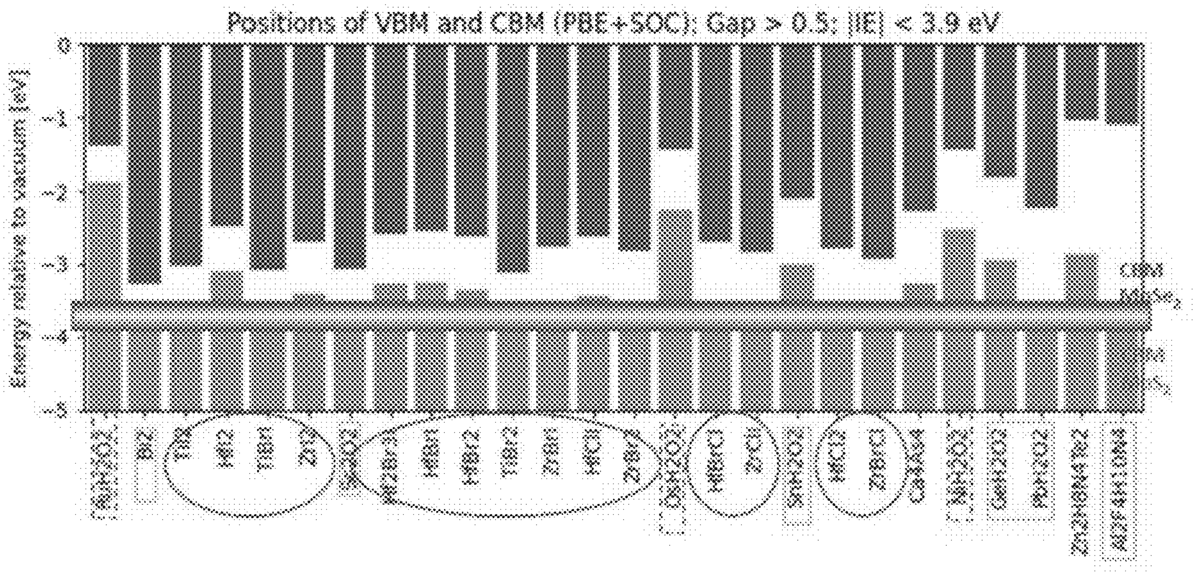
FIG. 5 is a diagram showing energy relative to vacuum for various compounds.

The results are shown in FIG. 5. Removing false positives (shown in yellow boxes in FIG. 5), 20 candidates were found:

Halides: $TiI_2$, TiBrI, $TiBr_2$, $ZrI_2$, ZrBrI, $ZrBr_2$, ZrClI, ZrClBr, $HfI_2$, $Hf_2Br_3I$, HfBrI, $HfBr_2$, HfClI, HfClBr, $HfCl_2$ 3 hydroxides with 3 cations (Ru, Os, Ni).

$Ca_4As_4$ and $Zn_2H_8N_4Te_2$

Figure 6:
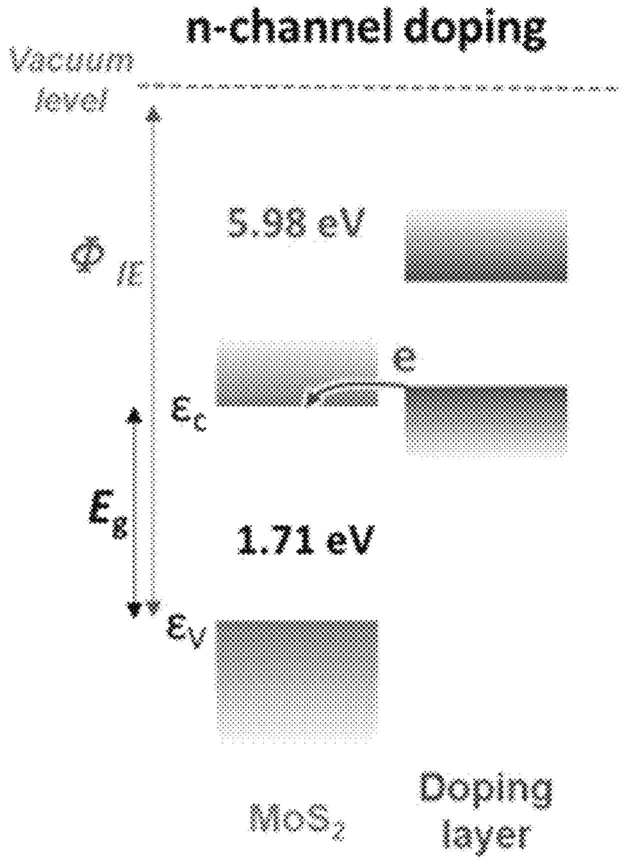
FIG. 6 is a schematic diagram for n-doping TMDs via a neighboring dopant layer, FIG. 7 are graphs showing the electronic structure of (left) $MoS_2$ monolayer and (right) monolayer $Ni(OH)_2$.

FIG. 6 is a schematic diagram for n-doping TMDs via a neighboring dopant layer, by which embodiments of the present disclosure can be obtained.

Figure 7:
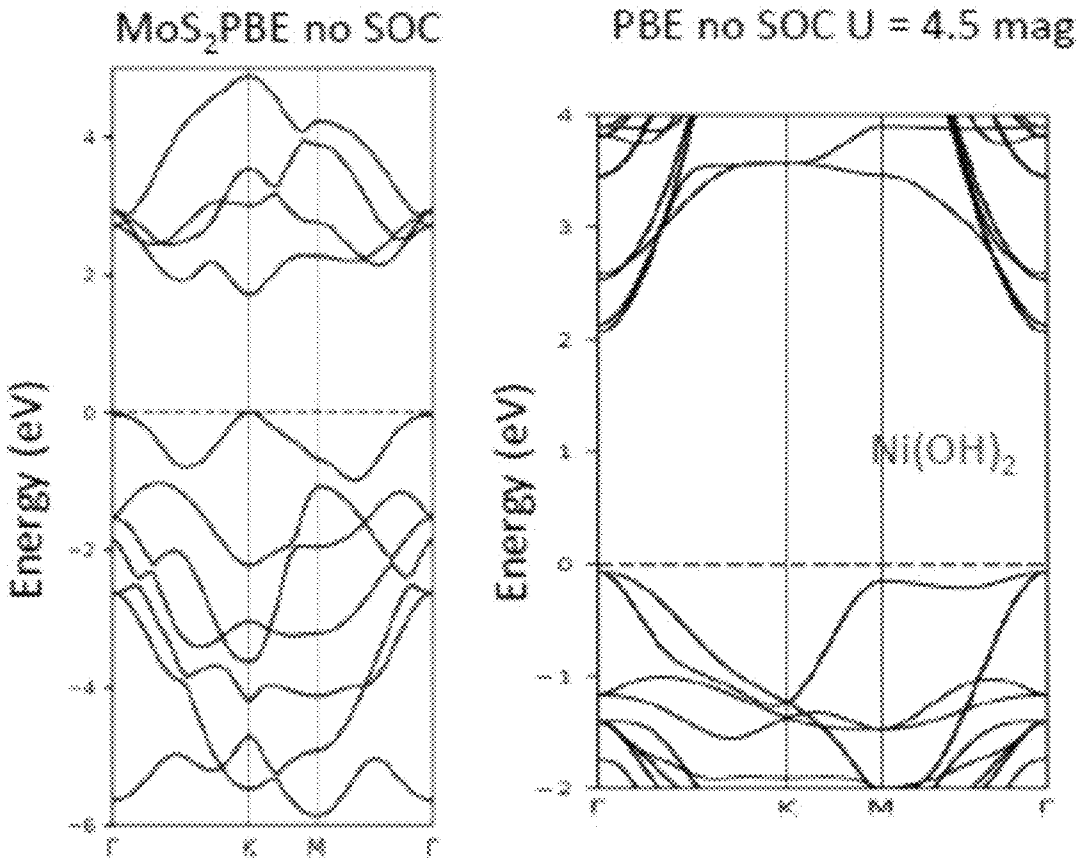
Figure 8:
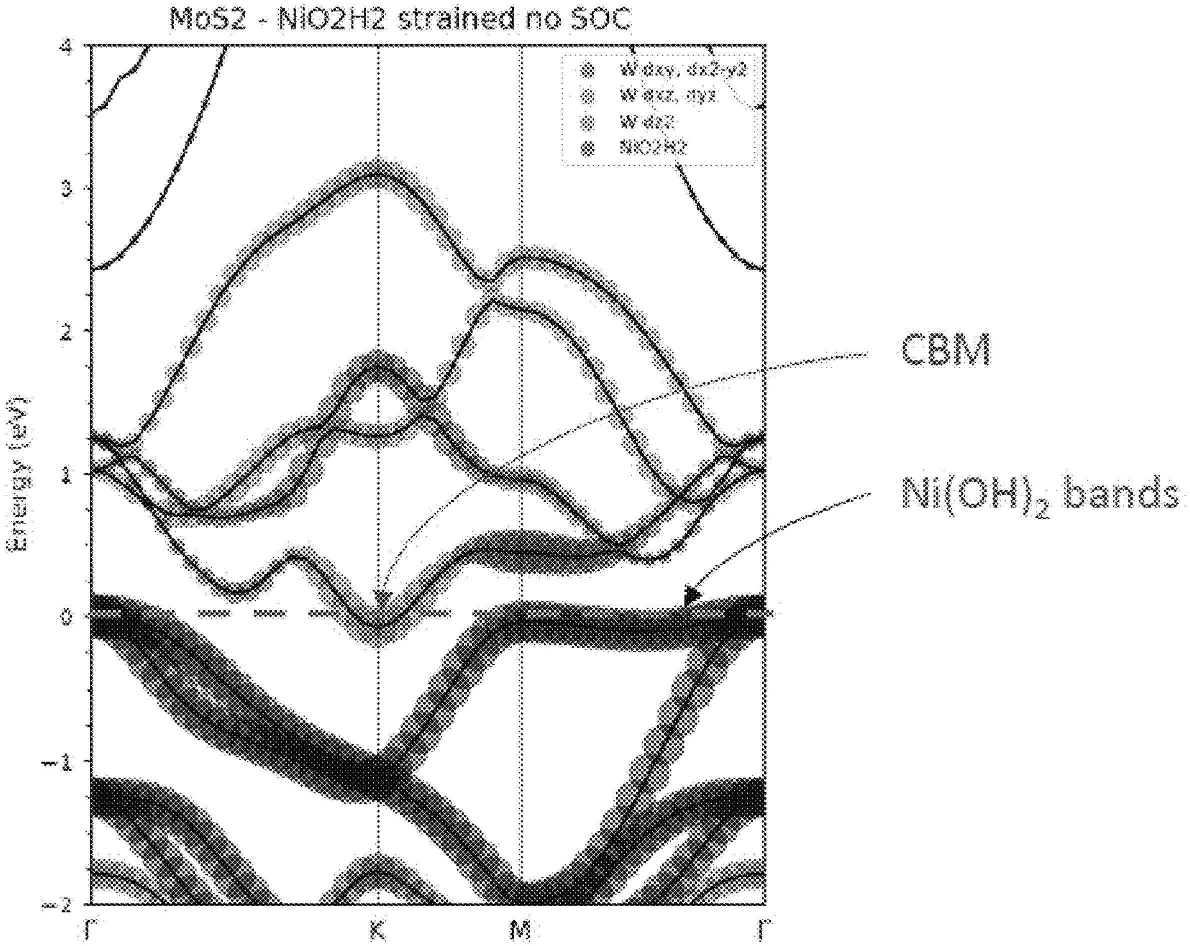
FIG. 8 is a graph showing the electronic structure of monolayer $MoS_2$ interfaced with monolayer $Ni(OH)_2$, wherein the Fermi level (green) is set to zero, FIG. 9 are graphs showing the electronic structure of (left) $MoS_2$ monolayer and (right) monolayer $ZrI_2$.

In one embodiment of the present disclosure, FIG. 7 shows the electronic structure of (left) $MoS_2$ monolayer and (right) monolayer $Ni(OH)_2$, and in view of the scheme shown in FIG. 6, the electronic structure of monolayer $MoS_2$ is interfaced with monolayer $Ni(OH)_2$ as shown in FIG. 8, with the Fermi level (green) being set to zero. The conduction band minima (CBM) of $MoS_2$ crosses the Fermi level leading to a net n-doping in the TMD layer via surface charge transfer from the $Ni(OH)_2$ layer.

The band alignment between $MoS_2$ and $Ni(OH)_2$ is such that a surface charge transfer induced n-doping can occur in $MoS_2$.

Figure 9:
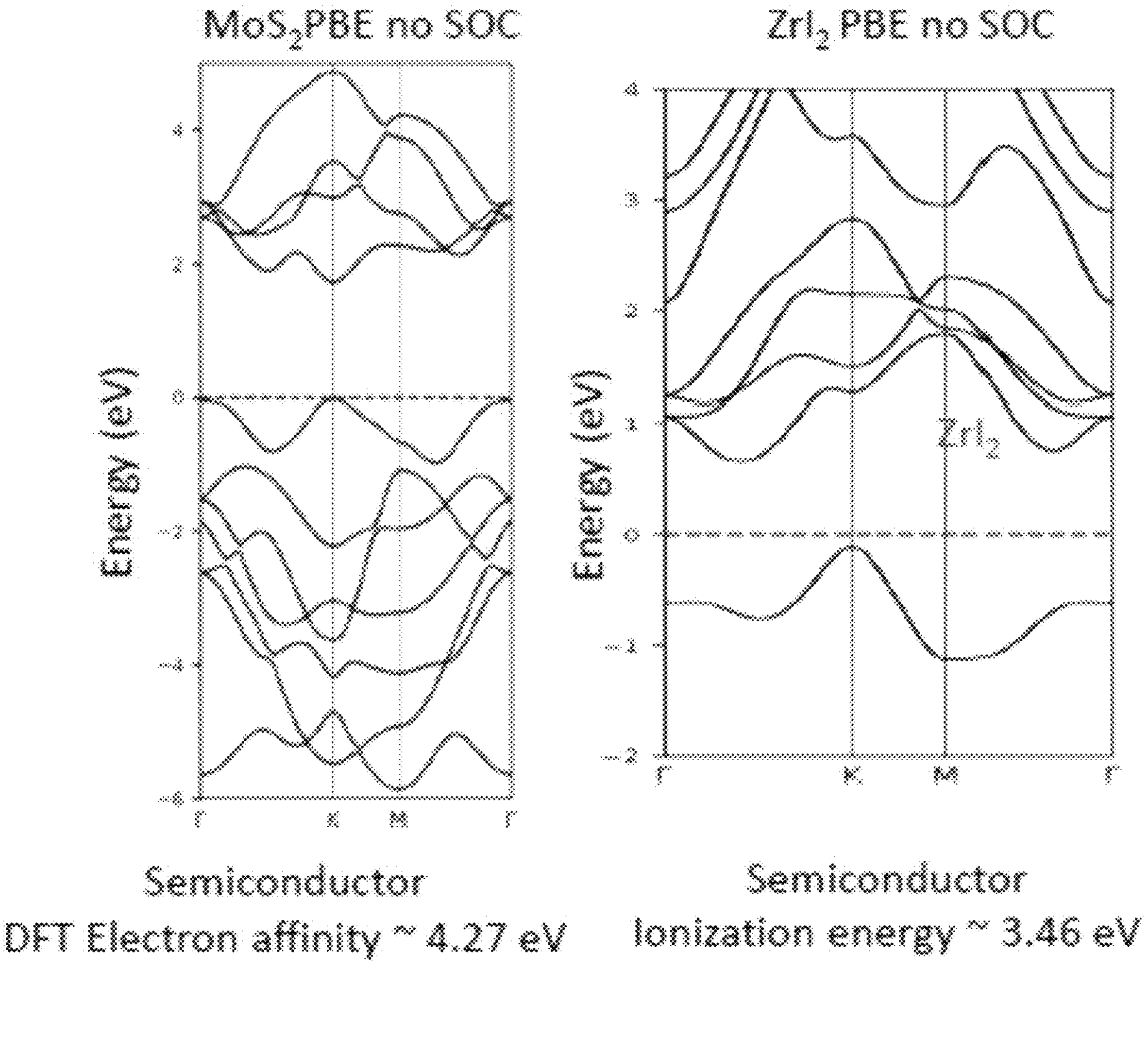
Figure 10:
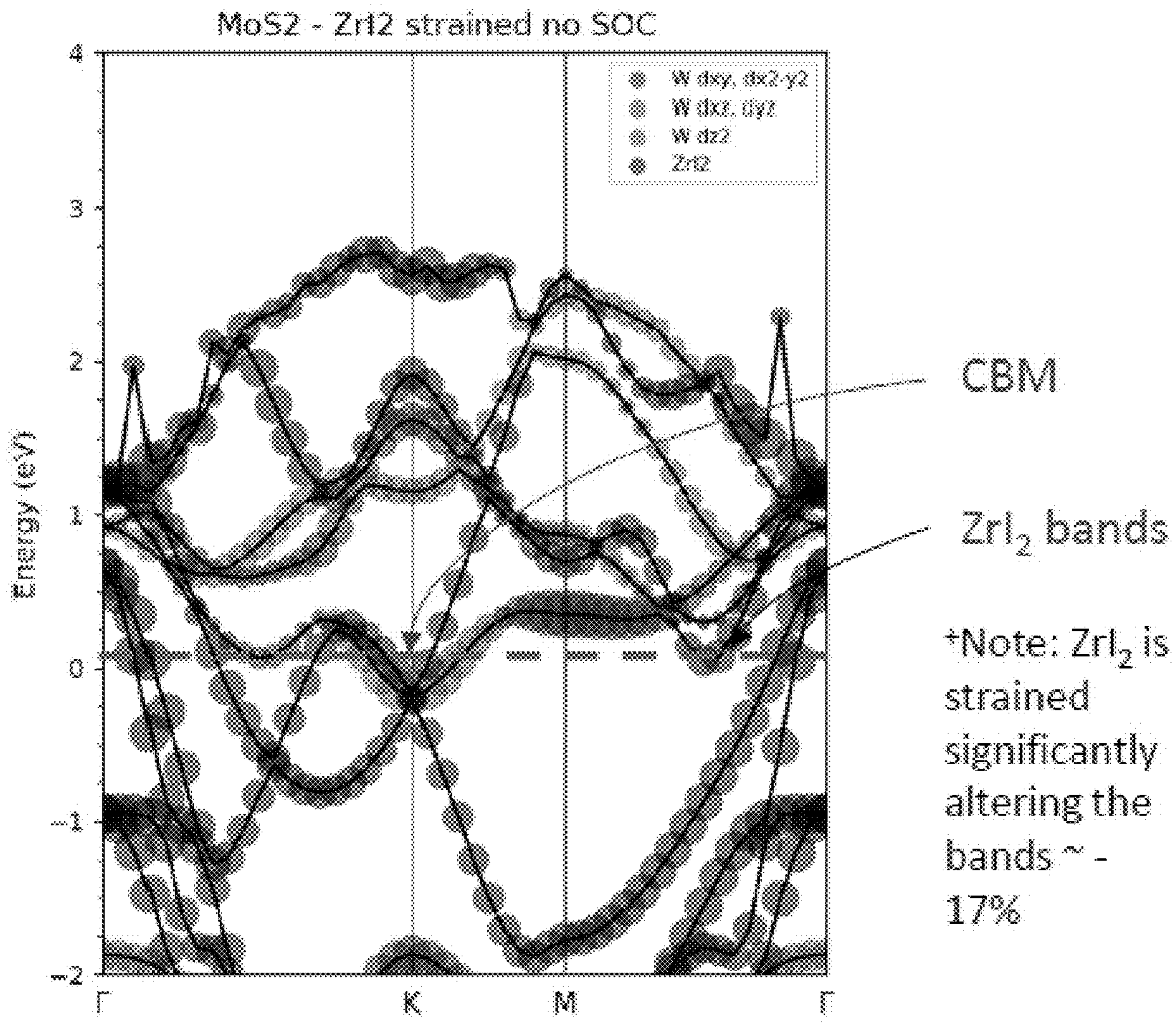
FIG. 10 is a graph showing the electronic structure of monolayer $MoS_2$ interfaced with monolayer $ZrI_2$, wherein the Fermi level (green) is set to zero.

In another embodiment of the present disclosure, FIG. 9 shows the electronic structure of (left) $MoS_2$ monolayer and (right) monolayer $ZrI_2$, and in view of the scheme shown in FIG. 6, the electronic structure of monolayer $MoS_2$ is interfaced with monolayer $ZrI_2$ as shown in FIG. 10, with the Fermi level (green) being set to zero. The conduction band minima (CBM) of $MoS_2$ crosses the Fermi level leading to a net n-doping in the TMD layer via surface charge transfer from the $ZrI_2$ layer.

The band alignment between $MoS_2$ and $ZrI_2$ is such that a surface charge transfer induced n-doping can occur in $MoS_2$.

Figure 11:
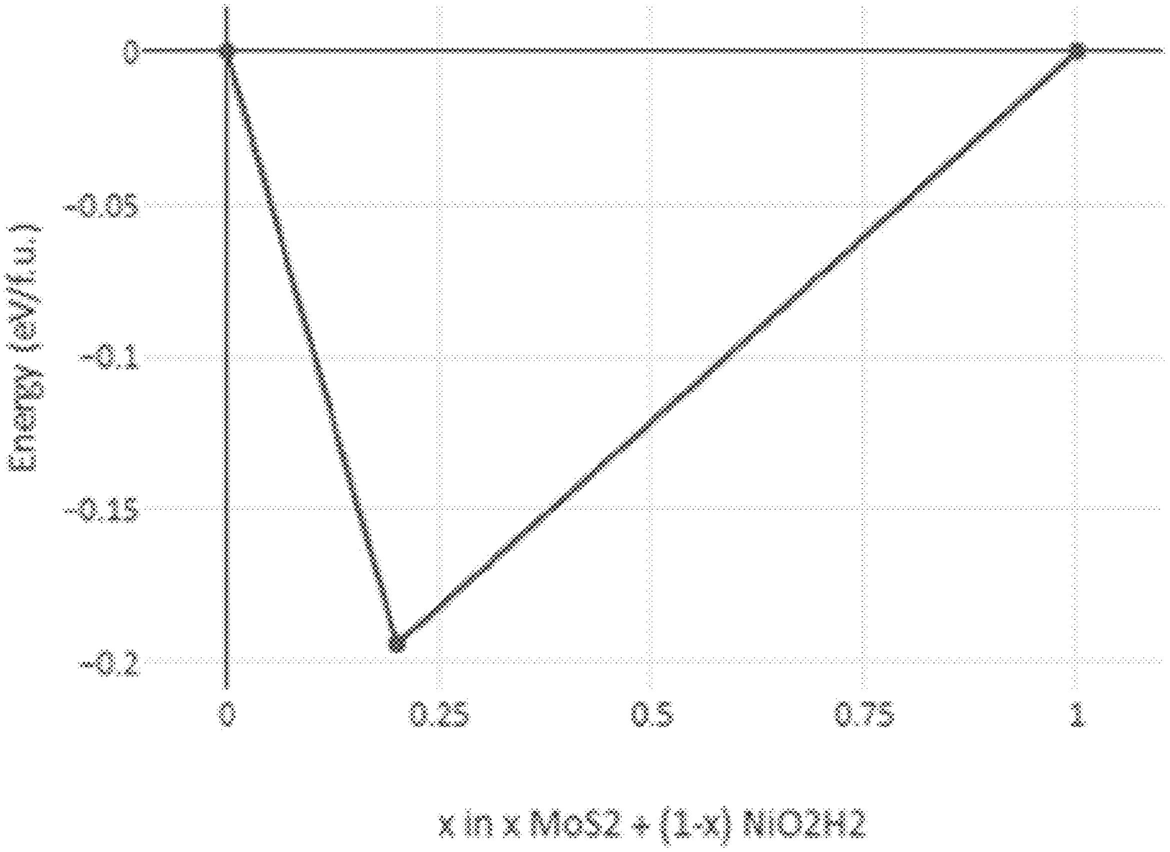
FIG. 11 is a graph showing reaction energy as a function of mixing ratio between $MoS_2$ and $Ni(OH)_2$.
Figure 12:
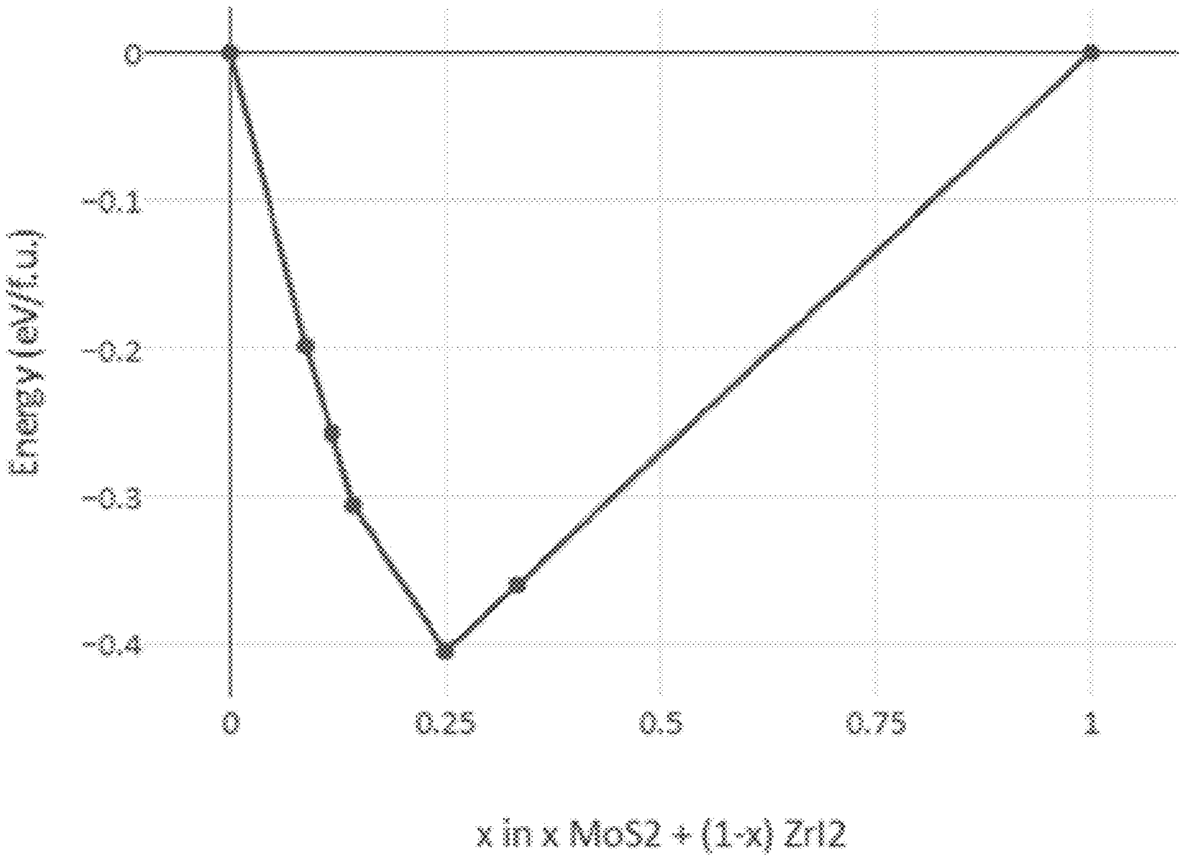
FIG. 12 is a graph showing reaction energy as a function of mixing ratio between $MoS_2$ and $ZrI_2$.

Reaction energy as a function of mixing ratio between $MoS_2$ and $Ni(OH)_2$ is shown in FIG. 11, and reaction energy as a function of mixing ratio between $MoS_2$ and $ZrI_2$ is shown in FIG. 12. With respect to the thermodynamic stability of the $MoS_2$ surface with the dopant layer, while there is a nominal energy gain of ~0.2 eV/f·u. for $Ni(OH)_2$ and ~0.4 eV/f·u. for $ZrI_2$ the surfaces are essentially non-reactive from thermodynamics as the energy gain is so small that it is unlikely to overcome the kinetic barrier of bond breakage.

Figure 13:
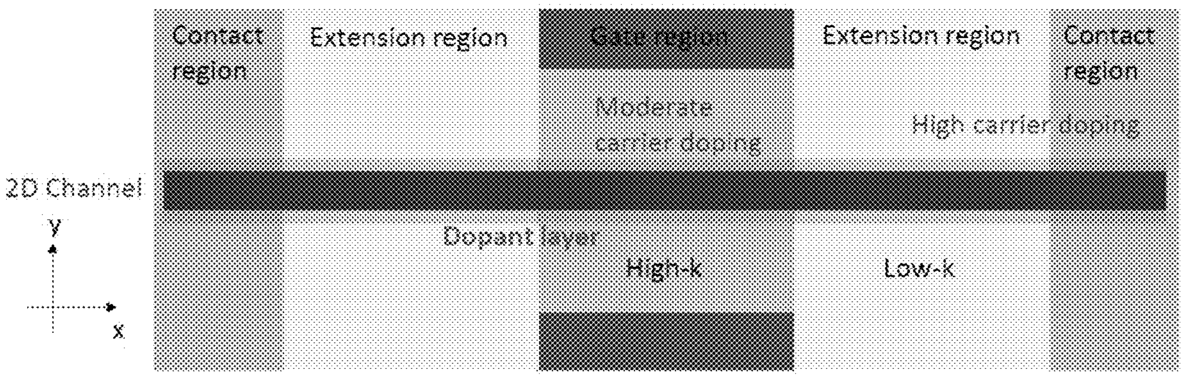
FIG. 13 is a schematic diagram of the top view of the different regions in a typical FET (e.g., a slice of a Gate All Around (GAA) FET)
Figure 14:
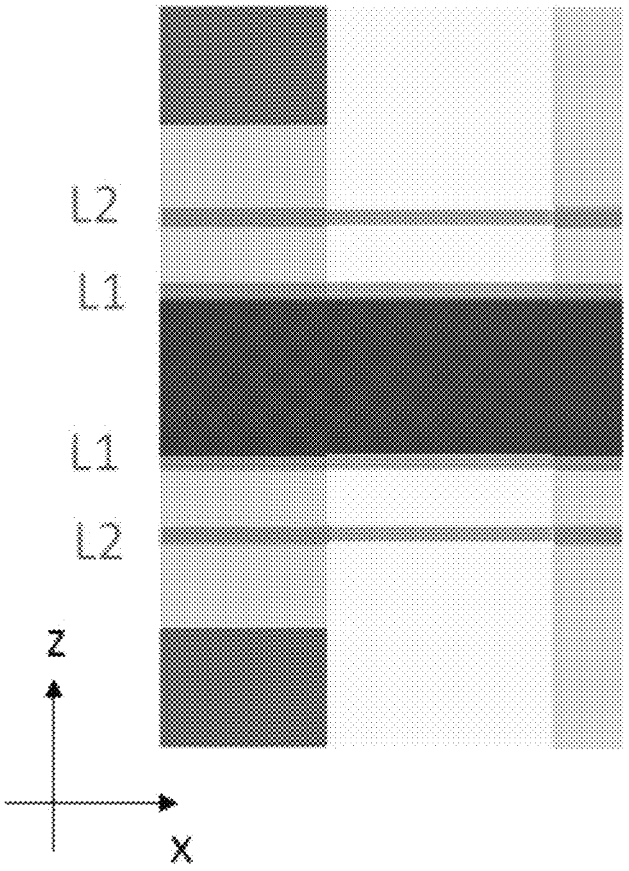
FIG. 14 is a schematic diagram of the side view of the different regions in a typical FET.

Thus, an embodiment of the present disclosure can be a structure including a dopant layer as shown in FIGS. 13 and 14.

In particular, FIG. 13 shows a schematic diagram of the top view of the different regions in a typical FET (e.g., a slice of a Gate All Around (GAA) FET). A dopant layer (in green) surrounds the channel layer (in red). The dopant layer need not be directly interfacing the channel layer (i.e., it need not be at the channel layer), but can be a few layers away (e.g., three layers away). Fractional dopant concentration relative to the surrounding layer (x) of 1 is shown in the schematic diagram. If one whole layer is not fully doped, then $0<x<1$.

FIG. 14 shows a schematic diagram of the side-view of the different regions in a typical FET. The dopant layer (in green) surrounds the channel layer (in red). The dopant layer need not be directly interfacing the channel layer (as in L1) and can be a few layers away (as in L2).

An embodiment of the present disclosure includes a method for fabricating a channel, comprising:

depositing a delta-doped layer onto a high-k layer, and n-doping a transition metal dichalcogenide layer, wherein the delta-doped layer has a low dielectric constant, wherein a band gap of the delta-doped layer is >0.1 eV, wherein an absolute value of ionization energy of the delta-doped layer is less than an absolute value of the electron affinity of the transition metal dichalcogenide layer, wherein the delta-doped layer includes one of a halide, hydroxide, chalcogenide, oxide, arsenide, or multi-anion compound, and wherein a fractional ratio of the delta-doped layer to the high-k layer is between 0 and 0.3.

In this regard, the delta-doped layer has a low dielectric constant (i.e., below the dielectric constant of silicon nitride). The dielectric constant of the delta-doped layer is preferably below the dielectric constant of silicon dioxide, more preferably below 3.5, still more preferably below 3, and particularly preferably below 2.5. The delta-doped layer can comprise, e.g., amorphous boron nitride, $SiO_xF_y$, or amorphous SiCOH.

The delta-doped layer is deposited on the high-k layer, e.g., by chemical vapor deposition.

The high-k layer can be a layer with a dielectric constant which is higher than that of silicon dioxide, preferably higher than that of silicon nitride. In particular, the high-k layer can be a layer with a dielectric constant which is greater than 3.9, preferably greater than 7, more preferably greater than 8, still more preferably greater than 15. The high-k layer can comprise, e.g., $HfO_2$, $Al_2O_3$, $Ta_2O_5$, or $Zr_xHf_{1-x}O_2$.

By carrying out such a method, a structure of the present disclosure can be obtained.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A structure comprising a dopant layer at or within 3 nm from a channel comprising at least one transition metal dichalcogenide to n-dope the at least one transition metal dichalcogenide, wherein the dopant layer comprises at least one of:

at least one of halides represented by MX2, wherein M is Ti, Zr, or Hf, and X is at least one of CI, Br, or I.

2. The structure according to claim 1, wherein the dopant layer is at the channel to n-dope the at least one transition metal dichalcogenide.

* * * * *